(12) United States Patent
Lin et al.

(10) Patent No.: US 12,256,519 B2
(45) Date of Patent: Mar. 18, 2025

(54) IMMERSION COOLING SYSTEM AND IMMERSION COOLING METHOD

(71) Applicant: DELTA ELECTRONICS, INC., Taoyuan (TW)

(72) Inventors: Wei-Chih Lin, Taoyuan (TW); Ren-Chun Chang, Taoyuan (TW); Yan-Hui Jian, Taoyuan (TW); Chia-Hsing Chen, Taoyuan (TW); Li-Hsiu Chen, Taoyuan (TW); Wen-Yin Tsai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 242 days.

(21) Appl. No.: 17/804,567

(22) Filed: May 30, 2022

(65) Prior Publication Data
US 2023/0027917 A1 Jan. 26, 2023

Related U.S. Application Data

(60) Provisional application No. 63/223,984, filed on Jul. 21, 2021.

(30) Foreign Application Priority Data

Feb. 17, 2022 (CN) .......................... 202210147926.8

(51) Int. Cl.
*H05K 7/20* (2006.01)
(52) U.S. Cl.
CPC ......... *H05K 7/203* (2013.01); *H05K 7/20318* (2013.01); *H05K 7/20336* (2013.01); *H05K 7/20381* (2013.01)

(58) Field of Classification Search
CPC .............. H05K 7/203; H05K 7/20318; H05K 7/20336; H05K 7/20381; H05K 7/20354
See application file for complete search history.

(56) References Cited

U.S. PATENT DOCUMENTS

| | | | | |
|---|---|---|---|---|
| 2,961,476 A | * | 11/1960 | Maslin | H01F 27/18 62/116 |
| 3,512,582 A | * | 5/1970 | Chu | H05K 7/203 257/E23.088 |
| 4,680,001 A | * | 7/1987 | Waters | B29C 45/7306 165/104.21 |
| 8,713,957 B2 | | 5/2014 | Campbell et al. | |
| 9,560,789 B2 | | 1/2017 | Smith | |

(Continued)

FOREIGN PATENT DOCUMENTS

CN 200974767 Y 11/2007
CN 105607715 A 5/2016
(Continued)

*Primary Examiner* — Tavia Sullens
(74) *Attorney, Agent, or Firm* — CKC & Partners Co., LLC

(57) ABSTRACT

An immersion cooling system includes a cooling tank, a housing and a valve. The coolant tank is configured to accommodate a liquid coolant and an electronic device immersed in the liquid coolant. The housing covers a side of the cooling tank and thereby forms an enclosure. The valve has two ports, one of which communicates with the enclosure and the other communicates with a part of the cooling tank above the liquid coolant. The valve is configured to open in response to a gas pressure inside the cooling tank exceeding an upper limit.

14 Claims, 3 Drawing Sheets

(56) References Cited

U.S. PATENT DOCUMENTS

| | | |
|---|---|---|
| 9,844,166 B2 | 12/2017 | Shelnutt et al. |
| 10,143,113 B2 | 11/2018 | Shelnutt et al. |
| 10,206,307 B2 | 2/2019 | Lau |
| 10,773,192 B1 | 9/2020 | Lau |
| 10,925,188 B1 | 2/2021 | Keehn et al. |
| 10,966,349 B1 | 3/2021 | Lau |
| 2016/0345461 A1 | 11/2016 | Smith |
| 2017/0064862 A1 | 3/2017 | Miyoshi |
| 2019/0159360 A1 | 5/2019 | Uchida |
| 2020/0305310 A1 | 9/2020 | Alissa et al. |

FOREIGN PATENT DOCUMENTS

| | | |
|---|---|---|
| CN | 108141991 A | 6/2018 |
| CN | 108966603 A | 12/2018 |
| EP | 0121267 A1 | 10/1984 |
| JP | S4882319 A | 11/1973 |
| TW | I633407 B | 8/2018 |
| TW | I640239 B | 11/2018 |
| TW | 202020385 A | 6/2020 |
| TW | M610160 U | 4/2021 |

\* cited by examiner

IMMERSION COOLING SYSTEM AND IMMERSION COOLING METHOD

RELATED APPLICATIONS

This application claims priority to U.S. Provisional Application Ser. No. 63/223,984 filed Jul. 21, 2021, and China Application Serial Number 202210147926.8, filed Feb. 17, 2022, the disclosures of which are incorporated herein by reference in their entireties.

BACKGROUND

Technical Field

The present disclosure relates to an immersion cooling system and an immersion cooling method.

Description of Related Art

Generally speaking, when an immersion cooling system is provided for the cooling of electronic equipment, the pressure of the immersion cooling system would vary with the workload of the electronic equipment. When the system pressure becomes too high, the boiling point of the liquid coolant would rise accordingly, which leads to poor heat dissipation for the electronic equipment. When the system pressure becomes too low, air or moisture from the surrounding is more likely to leak into the system. In addition, excessively high and excessively low system pressure both could cause structural damage/deformation of the system. Accordingly, pressure control is an important issue in immersion cooling systems.

SUMMARY

In view of the foregoing, one of the objects of the present disclosure is to provide an immersion cooling system that can effectively control system pressure.

To achieve the objective stated above, in accordance with an embodiment of the present disclosure, an immersion cooling system includes a cooling tank, a housing and a first valve. The cooling tank is configured to accommodate a liquid coolant and an electronic device immersed in the liquid coolant. The housing covers a side of the cooling tank and thereby forms an enclosure. The first valve has two ports, one of which communicates with the enclosure and the other communicates with a part of the cooling tank above the liquid coolant. The first valve is configured to open in response to a gas pressure inside the cooling tank exceeding a first upper limit.

In one or more embodiments of the present disclosure, the system further includes a pressure sensor and a controller. The pressure sensor is configured to provide a sensing signal indicative of the gas pressure inside the cooling tank. The controller is configured to determine whether the gas pressure inside the cooling tank exceeds the first upper limit based on the sensing signal, and is configured to instruct the first valve to open if it is determined that the gas pressure inside the cooling tank exceeds the first upper limit.

In one or more embodiments of the present disclosure, the system further includes a safety valve having two ports, one of which communicates with the enclosure and the other communicates with the part of the cooling tank above the liquid coolant. The safety valve is configured to open automatically in response to the gas pressure inside the cooling tank exceeding a second upper limit. The second upper limit is higher than the first upper limit.

In one or more embodiments of the present disclosure, the system further includes a condenser and a recycling pipe. The condenser is disposed in the enclosure and is configured to condense a vaporized coolant in the enclosure. The vaporized coolant vaporized from the liquid coolant. The recycling pipe is connected to the enclosure and the cooling tank. The recycling pipe is configured to guide the liquid coolant produced by the condenser to flow into the cooling tank.

In one or more embodiments of the present disclosure, the system further includes a condenser disposed in the cooling tank and configured to perform a condensing operation. The condensing operation includes causing a vaporized coolant which vaporized from the liquid coolant to condense. When the first valve is closed, the condenser is configured to speed up or slow down the condensing operation as the gas pressure inside the cooling tank changes.

In one or more embodiments of the present disclosure, the system further includes an expansion device communicating with the part of the cooling tank above the liquid coolant. When the first valve is closed, the expansion device is configured to adjust its volume as the gas pressure inside the cooling tank changes.

In one or more embodiments of the present disclosure, the system further includes a condenser. When the gas pressure inside the cooling tank exceeds a threshold value, the condenser is configured to condense at least part of a vapor flowing towards the expansion device. The threshold value is lower than the first upper limit.

In one or more embodiments of the present disclosure, the system further includes a second valve having two ports, one of which communicates with the cooling tank and the other communicates with a surrounding environment external to the cooling tank and the housing. The second valve is configured to open in response to the gas pressure inside the cooling tank dropping below a lower limit.

In accordance with an embodiment of the present disclosure, an immersion cooling method includes: immersing an electronic device in a liquid coolant in a cooling tank; providing a housing, the housing covering a side of the cooling tank and thereby forming an enclosure; and opening a first valve in response to a gas pressure inside the cooling tank exceeding a first upper limit, wherein the opening of the first valve enables flow of gas from the cooling tank to the enclosure.

In one or more embodiments of the present disclosure, the step of opening the first valve includes: receiving a sensing signal from a pressure sensor, the sensing signal being indicative of the gas pressure inside the cooling tank; determining whether the gas pressure inside the cooling tank exceeds the first upper limit based on the sensing signal; and instructing the first valve to open if it is determined that the gas pressure inside the cooling tank exceeds the first upper limit.

In one or more embodiments of the present disclosure, the method further includes: providing a safety valve having two ports, one of which communicates with the enclosure and the other communicates with a part of the cooling tank above the liquid coolant. The safety valve is configured to open automatically in response to the gas pressure inside the cooling tank exceeding a second upper limit. The second upper limit is higher than the first upper limit.

In one or more embodiments of the present disclosure, the method further includes: condensing a vaporized coolant in the enclosure, wherein the vaporized coolant vaporized from the liquid coolant; and guiding the liquid coolant condensed from the vaporized coolant in the enclosure to flow into the cooling tank.

In one or more embodiments of the present disclosure, the method further includes: opening a second valve in response to the gas pressure inside the cooling tank dropping below a lower limit. The opening of the second valve enables flow of gas from a surrounding environment to the cooling tank. The surrounding environment is external to the cooling tank and the housing.

In one or more embodiments of the present disclosure, the method further includes: before the first valve is opened, controlling the gas pressure inside the cooling tank by a first condenser located in the cooling tank or by an expansion device communicating with the cooling tank.

In one or more embodiments of the present disclosure, the method further includes: condensing, by a second condenser, at least part of a vapor flowing from the cooling tank towards the expansion device when the gas pressure inside the cooling tank exceeds a threshold value, wherein the threshold value is lower than the first upper limit.

In sum, in the immersion cooling system of the present disclosure, when the gas pressure inside the cooling tank is too high, the gas inside the cooling tank can be discharged to an enclosure located on a side of the cooling tank, rather than being discharged directly to the atmosphere. By this arrangement, vaporized coolant would not be lost. The vaporized coolant can be collected by the enclosure and can be recycled to the cooling tank for reuse.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
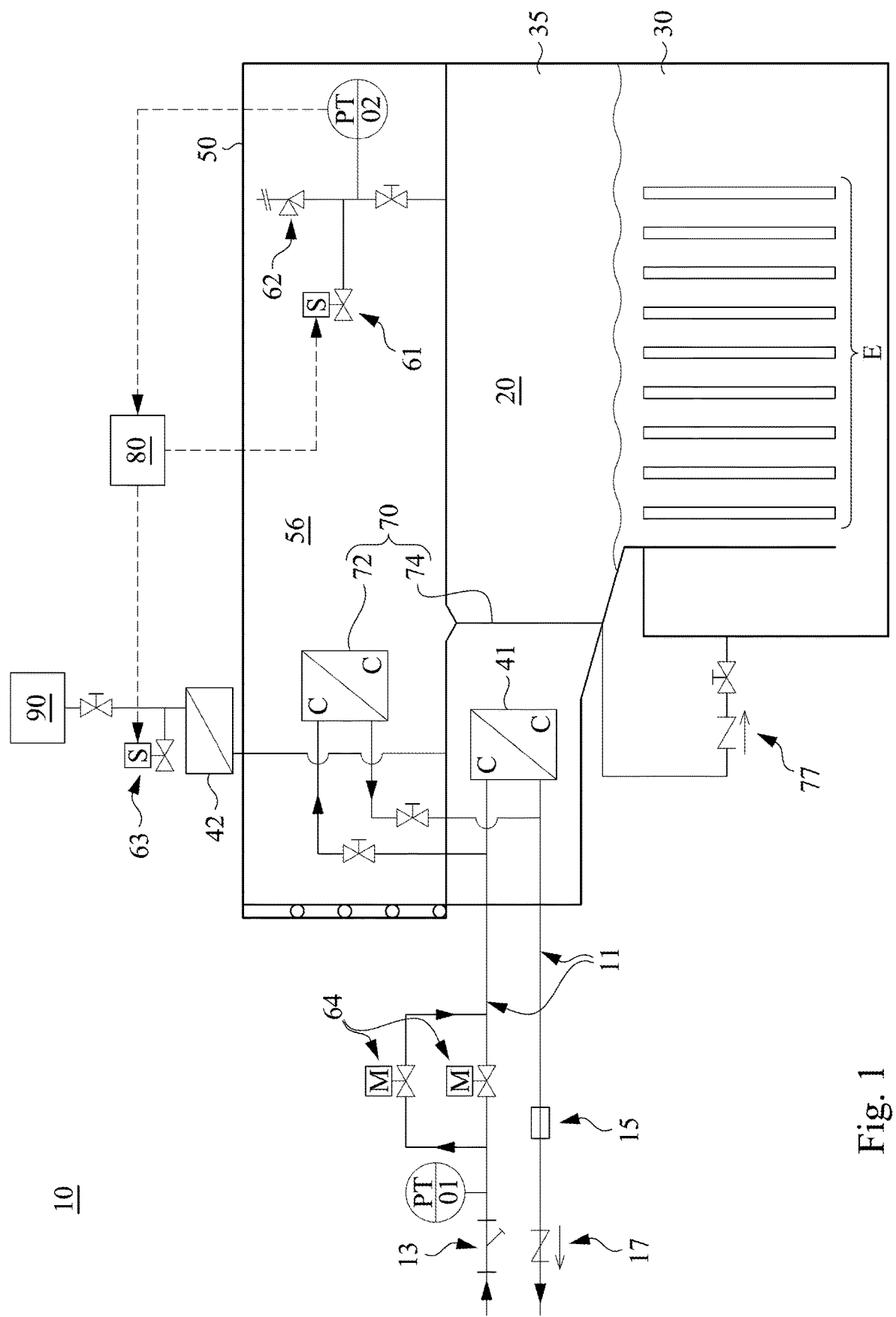
FIG. 1 illustrates a schematic view of an immersion cooling system in accordance with an embodiment of the present disclosure.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Reference is made to FIG. 1. An immersion cooling system 10 includes a cooling tank 20. The cooling tank 20 is configured to accommodate a liquid coolant 30 and one or more electronic devices E immersed in the liquid coolant 30. The electronic devices E may include, for example, one or more computer servers or data storage devices. During operation, the electronic devices E produce heat. The liquid coolant 30 is configured to contact the electronic devices E and absorb heat therefrom, so as to facilitate the cooling of the electronic devices E. The liquid coolant 30 is a non-conductive liquid, such as a dielectric liquid.

As shown in FIG. 1, in some embodiments, the liquid coolant 30 in the cooling tank 20 partially vaporizes as a result of absorbing heat from the electronic devices E. The part of the cooling tank 20 above the liquid coolant 30 includes a vaporized coolant 35 that vaporized from the liquid coolant 30. The immersion cooling system 10 further includes a condenser 41. The condenser 41 is disposed in the cooling tank 20 and is configured to perform a condensing operation. The condensing operation includes causing the vaporized coolant 35 to condense. In the two-phase cooling method described above, the liquid coolant 30 facilitates the cooling of the electronic devices E by repeating the process of: (i) absorbing heat from the electronic devices E and vaporizing; and (ii) being converted back to the liquid state by the condenser 41.

Generally speaking, the gas pressure inside the cooling tank 20 is positively correlated with the workload of the electronic devices E. Specifically, when the workload of the electronic devices E is increased (e.g., when the amount of computation performed by the electronic devices E is increased), the electronic devices E would generate more heat per unit time. As a result, the liquid coolant 30 would vaporize more quickly, and the gas pressure inside the cooling tank 20 increases accordingly. On the other hand, when the workload of the electronic devices E is reduced, the electronic devices E would generate less heat per unit time. As a result, the liquid coolant 30 would vaporize more slowly, and the gas pressure inside the cooling tank 20 decreases accordingly.

As shown in FIG. 1, the immersion cooling system 10 further includes a housing 50. The housing 50 covers a side of the cooling tank 20 and thereby forms an enclosure 56. The enclosure 56 has a fixed volume. In the illustrated embodiment, the housing 50 covers the top side of the cooling tank 20. In some embodiments, the housing 50 may include metal, glass, acrylic, other suitable materials or any combination thereof.

As shown in FIG. 1, the immersion cooling system 10 further includes a valve 61. The valve 61 has two ports, one of which communicates with the enclosure 56 and the other communicates with the part of the cooling tank 20 above the liquid coolant 30 (i.e., the space inside the cooling tank 20 that is filled with the vaporized coolant 35). The valve 61 is configured to switch between an open state and a closed state. When the valve 61 is in the open state, the valve 61 allows the flow of gas between the enclosure 56 and the cooling tank 20. When the valve 61 is in the closed state, the valve 61 prohibits the flow of gas between the enclosure 56 and the cooling tank 20.

Continuing from the discussion in the previous paragraph, the valve 61 is configured to open in response to the gas pressure inside the cooling tank 20 exceeding a first upper limit. The opening of the valve 61 enables the flow of gas from the cooling tank 20 to the enclosure 56, and the gas pressure inside the cooling tank 20 is reduced accordingly. As a result, structural damage of the cooling tank 20 can be prevented, and the liquid coolant 30 can be kept from having an excessively high boiling point as well, which could lead to poor heat dissipation for the electronic devices E. The gas flowing from the cooling tank 20 to the enclosure 56 includes the vaporized coolant 35, and may additionally include other gases mixing in the vaporized coolant 35, such as air or water vapor.

In the immersion cooling system 10 of the present disclosure, when the gas pressure inside the cooling tank 20 is too high, the gas inside the cooling tank 20 can be discharged to the enclosure 56 located on a side of the cooling tank 20, rather than being discharged directly to the atmosphere. By this arrangement, the vaporized coolant 35 would not be lost. The vaporized coolant 35 can be collected by the enclosure 56 and can be recycled to the cooling tank 20 for reuse.

As shown in FIG. 1, in some embodiments, the immersion cooling system 10 further includes a recycling system 70. The recycling system 70 includes a condenser 72 and a recycling pipe 74. The condenser 72 is disposed in the enclosure 56 and is configured to condense the vaporized coolant 35 in the enclosure 56. The recycling pipe 74 has two opposite ends, one of which is connected to the enclosure 56 and the other is connected to the cooling tank 20. The recycling pipe 74 is configured to guide the liquid coolant 30 produced by the condenser 72 to flow into the cooling tank 20. In some embodiments, the recycling pipe 74 includes a check valve 77 configured to prevent the backflow of the liquid coolant 30 or the vaporized coolant 35 from the cooling tank 20 to the enclosure 56.

As shown in FIG. 1, in some embodiments, the immersion cooling system 10 further includes a pressure sensor PT02 and a controller 80. The pressure sensor PT02 is configured to provide a sensing signal indicative of the gas pressure inside the cooling tank 20. The controller 80 is communicably connected to the pressure sensor PT02 and is configured to receive the sensing signal from the pressure sensor PT02. The controller 80 is further configured to determine whether the gas pressure inside the cooling tank 20 exceeds the first upper limit based on the sensing signal. If it is determined that the gas pressure inside the cooling tank 20 exceeds the first upper limit, then the controller 80 instructs the valve 61 to open (e.g., by sending a control signal to the valve 61). In some embodiments, the valve 61 is a solenoid valve. In some embodiments, the pressure sensor PT02 is configured to measure a pressure difference between the cooling tank 20 and the enclosure 56.

As shown in FIG. 1, in some embodiments, the immersion cooling system 10 further includes a safety valve 62. The safety valve 62 has two ports, one of which communicates with the enclosure 56 and the other communicates with the part of the cooling tank 20 above the liquid coolant 30. The safety valve 62 is configured to open automatically in response to the gas pressure inside the cooling tank 20 exceeding a second upper limit. The second upper limit is higher than the first upper limit. By this arrangement, gas can be discharged at an accelerated rate from the cooling tank 20 to the enclosure 56 when the gas pressure inside the cooling tank 20 further increases. In addition, with the provision of the safety valve 62, the reliability of the pressure control scheme of the immersion cooling system 10 can be improved. When the valve 61 malfunctions, the gas inside the cooling tank 20 can still be discharged to the enclosure 56 via the safety valve 62. In some embodiments, the valve 61 and the safety valve 62 are disposed on a pipe. The pipe is connected to the cooling tank 20 on one end and extends into the enclosure 56.

As shown in FIG. 1, in some embodiments, the immersion cooling system 10 further includes a valve 63. The valve 63 has two ports, one of which communicates with the cooling tank 20 and the other communicates with a surrounding environment external to the cooling tank 20 and the housing 50. The valve 63 is configured to open in response to the gas pressure inside the cooling tank 20 dropping below a lower limit. As a result, when the gas pressure inside the cooling tank 20 is too low, air can be drawn into the cooling tank 20 from the surrounding environment to increase the gas pressure inside the cooling tank 20 and prevent structural damage of the cooling tank 20.

In some embodiments, the valve 63 is a solenoid valve. In some embodiments, the controller 80 is configured to determine whether the gas pressure inside the cooling tank 20 drops below the lower limit based on the sensing signal provided by the pressure sensor PT02. If it is determined that the gas pressure inside the cooling tank 20 drops below the lower limit, then the controller 80 instructs the valve 63 to open (e.g., by sending a control signal to the valve 63). When the gas pressure inside the cooling tank 20 does not fall below the lower limit, the valve 63 stays closed.

In some embodiments, when the gas pressure inside the cooling tank 20 does not exceed the first upper limit and does not drop below the lower limit, the immersion cooling system 10 can take other pressure control measures to maintain the gas pressure inside the cooling tank 20. As shown in FIG. 1, in some embodiments, when the valve 61 is closed (i.e., before the valve 61 is opened), the condenser 41 is configured to speed up or slow down the condensing operation as the gas pressure inside the cooling tank 20 changes, so as to control the gas pressure inside the cooling tank 20. In some embodiments, the controller 80 is configured to control the condenser 41 to speed up or slow down the condensing operation based on the sensing signal provided by the pressure sensor PT02.

Specifically, when the gas pressure inside the cooling tank 20 increases but does not exceed the first upper limit, the condenser 41 is configured to speed up the condensing operation (e.g., increase the amount of the vaporized coolant 35 being condensed per unit time, or increase the amount of heat being removed from the cooling tank 20 per unit time) to lower the gas pressure inside the cooling tank 20. On the other hand, when the gas pressure inside the cooling tank 20 decreases but does not drop below the lower limit, the condenser 41 is configured to slow down the condensing operation (e.g., reduce the amount of the vaporized coolant 35 being condensed per unit time, or reduce the amount of heat being removed from the cooling tank 20 per unit time) to raise the gas pressure inside the cooling tank 20.

As shown in FIG. 1, in some embodiments, the condenser 41 is configured to receive a working fluid through a delivery pipe 11. The working fluid is configured to make heat exchange with the vaporized coolant 35 to cause the vaporized coolant 35 to condense and return to the liquid state, and the working fluid is discharged through the delivery pipe 11 after the heat exchange. In some embodiments, the delivery pipe 11 is provided with one or more flow control valves 64. The one or more flow control valves 64 are configured to regulate the amount of the working fluid passing through the condenser 41 (e.g., regulate the mass/volume flow rate of the working fluid), such that the condensing operation can be sped up or slowed down. In some embodiments, the one or more flow control valves 64 include a motorized valve. In some embodiments, the controller 80 is configured to control the one or more flow control valves 64 based on the sensing signal provided by the pressure sensor PT02.

As shown in FIG. 1, in some embodiments, the delivery pipe 11 is further provided with a pressure sensor PT01. The pressure sensor PT01 is configured to measure a pressure of the working fluid. In some embodiments, the delivery pipe 11 is further provided with a filter 13. The filter 13 is configured to filter the working fluid to remove pollutant from the working fluid before the working fluid enters the condenser 41. In some embodiments, the delivery pipe 11 is further provided with a flowmeter 15. The flowmeter 15 is configured to measure a flow rate of the working fluid. In some embodiments, the delivery pipe 11 is further provided with a check valve 17. The check valve 17 is configured to prevent the backflow of the working fluid.

As shown in FIG. 1, in some embodiments, the immersion cooling system 10 further includes an expansion device 90. The expansion device 90 is disposed on the outside of the cooling tank 20 and the housing 50, and the expansion device 90 communicates with the part of the cooling tank 20 above the liquid coolant 30 (the usage of "Element A communicates with Element B" herein refers to the relation that Element A is in fluid communication with Element B). When the valve 61 is closed, the expansion device 90 is configured to adjust its volume as the gas pressure inside the cooling tank 20 changes. In some embodiments, the expansion device 90 includes an elastic body. The internal space of the elastic body communicates with the cooling tank 20. In response an increase of the gas pressure inside the cooling tank 20, the elastic body is configured to automatically expand (i.e., increase its volume) to lower the gas pressure inside the cooling tank 20. In response a decrease of the gas pressure inside the cooling tank 20, the elastic body is configured to automatically shrink (i.e., decrease its volume) to raise the gas pressure inside the cooling tank 20.

As shown in FIG. 1, in some embodiments, the immersion cooling system 10 further includes a condenser 42. The condenser 42 is connected between the cooling tank 20 and the expansion device 90. Accordingly, gas flowing from the cooling tank 20 towards the expansion device 90 would pass through the condenser 42. When the gas pressure inside the cooling tank 20 exceeds a threshold value, the condenser 42 is activated and is configured to condense at least part of a vapor (including the vaporized coolant 35) flowing towards the expansion device 90. The threshold value is lower than the first upper limit. By this arrangement, the burden of the expansion device 90 can be reduced. In some embodiments, the expansion device 90 is connected to the cooling tank 20 via a pipe. The pipe passes through the condenser 42. When the condenser 42 is activated, the condensate produced by the condenser 42 (including the liquid coolant 30) can flow back to the cooling tank 20 along the pipe.

In some embodiments, the controller 80 is configured to determine whether the gas pressure inside the cooling tank 20 exceeds the threshold value based on the sensing signal provided by the pressure sensor PT02. If it is determined that the gas pressure inside the cooling tank 20 exceeds the threshold value, then the controller 80 activates/turns on the condenser 42. When the gas pressure inside the cooling tank 20 does not exceed the threshold value, the condenser 42 remains off.

Figure 2:
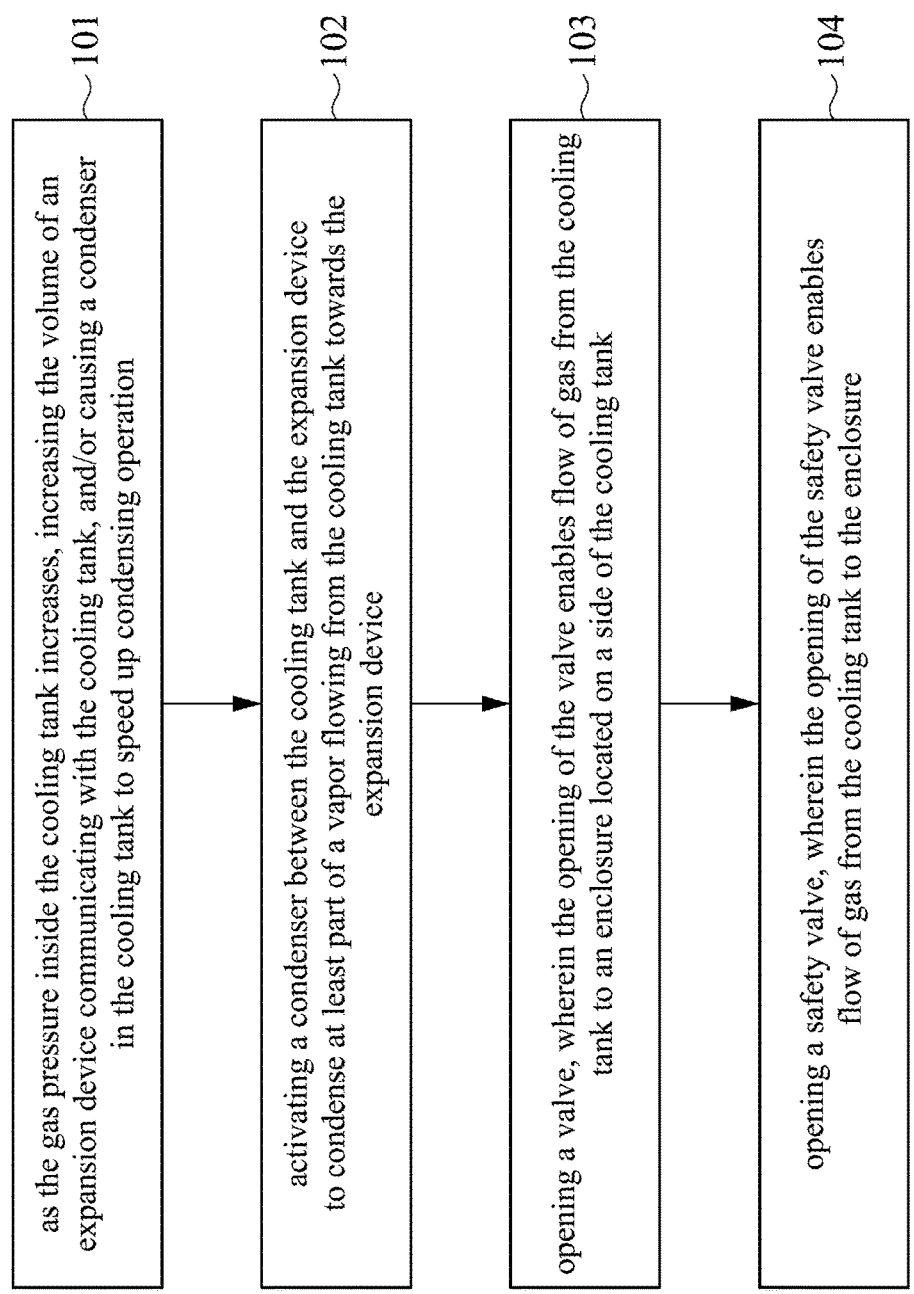
FIG. 2 illustrates a flowchart of an immersion cooling method in accordance with an embodiment of the present disclosure.

Reference is made to FIG. 2. The immersion cooling method 100 of the present embodiment includes a control flow in response to an increase of the gas pressure inside the cooling tank. With additional reference to FIG. 1, in step 101, control the gas pressure inside the cooling tank 20 by (i) increasing the volume of the expansion device 90, which communicates with the cooling tank 20, as the gas pressure inside the cooling tank 20 increases, and/or (ii) causing the condenser 41 in the cooling tank 20 to speed up the condensing operation as the gas pressure inside the cooling tank 20 increases.

As shown in FIGS. 1 and 2, if the gas pressure inside the cooling tank 20 exceeds a threshold value, then the immersion cooling method 100 continues to step 102, which includes activating the condenser 42 between the cooling tank 20 and the expansion device 90. The condenser 42, once activated, condenses at least part of a vapor flowing from the cooling tank 20 towards the expansion device 90.

As shown in FIGS. 1 and 2, if the gas pressure inside the cooling tank 20 further increases and exceeds a first upper limit, then the immersion cooling method 100 continues to step 103, which includes opening the valve 61. The opening of the valve 61 enables flow of gas from the cooling tank 20 to the enclosure 56 located on a side of the cooling tank 20.

As shown in FIGS. 1 and 2, if the gas pressure inside the cooling tank 20 further increases and exceeds a second upper limit, then the immersion cooling method 100 continues to step 104, which includes opening the safety valve 62. The opening of the safety valve 62 enables flow of gas from the cooling tank 20 to the enclosure 56.

Figure 3:
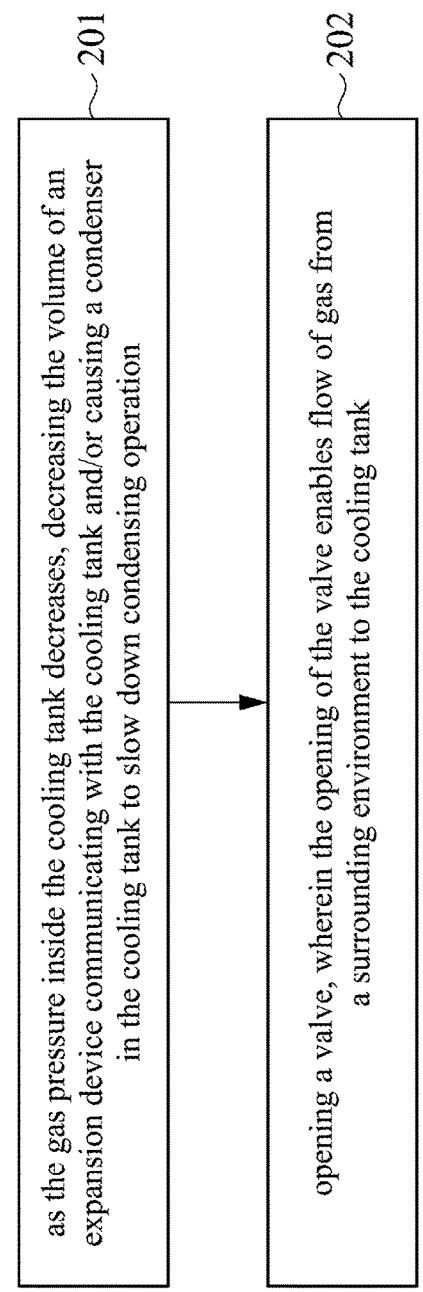
FIG. 3 illustrates a flowchart of an immersion cooling method in accordance with another embodiment of the present disclosure.

Reference is made to FIG. 3. The immersion cooling method 200 of the present embodiment includes a control flow in response to a decrease of the gas pressure inside the cooling tank. With additional reference to FIG. 1, in step 201, control the gas pressure inside the cooling tank 20 by (i) decreasing the volume of the expansion device 90, which communicates with the cooling tank 20, as the gas pressure inside the cooling tank 20 decreases, and/or (ii) causing the condenser 41 in the cooling tank 20 to slow down the condensing operation as the gas pressure inside the cooling tank 20 decreases.

As shown in FIGS. 1 and 3, if the gas pressure inside the cooling tank 20 drops below a lower limit, then the immersion cooling method 200 continues to step 202, which includes opening the valve 63. The opening of the valve 63 enables flow of gas from a surrounding environment to the cooling tank 20. The surrounding environment is external to the cooling tank 20 and the enclosure 56.

In sum, in the immersion cooling system of the present disclosure, when the gas pressure inside the cooling tank is too high, the gas inside the cooling tank can be discharged to an enclosure located on a side of the cooling tank, rather than being discharged directly to the atmosphere. By this arrangement, vaporized coolant would not be lost. The vaporized coolant can be collected by the enclosure and can be recycled to the cooling tank for reuse.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. An immersion cooling system, comprising:
   a cooling tank configured to accommodate a liquid coolant and an electronic device, the electronic device being immersed in the liquid coolant;
   a housing covering a side of the cooling tank and thereby forming an enclosure;
   a first valve having two ports, wherein one of the two ports of the first valve communicates with the enclosure and the other of the two ports of the first valve communicates with a part of the cooling tank above the liquid coolant, and wherein the first valve is configured to open in response to a gas pressure inside the cooling tank exceeding a first upper limit; and
   a safety valve having two ports, wherein one of the two ports of the safety valve directly communicates with the enclosure and the other of the two ports of the safety valve directly communicates with the part of the cooling tank above the liquid coolant, wherein the safety valve is configured to open automatically in response to the gas pressure inside the cooling tank exceeding a second upper limit to enable flow of gas from the cooling tank to the enclosure without losing gas to atmosphere, and the second upper limit is higher than the first upper limit.

2. The immersion cooling system of claim 1, further comprising a pressure sensor and a controller, wherein the pressure sensor is configured to provide a sensing signal indicative of the gas pressure inside the cooling tank, the controller is configured to determine whether the gas pressure inside the cooling tank exceeds the first upper limit based on the sensing signal, and wherein the first valve opening in response to the gas pressure inside the cooling tank exceeding the first upper limit comprises the controller instructing the first valve to open if it is determined that the gas pressure inside the cooling tank exceeds the first upper limit.

3. The immersion cooling system of claim 1, further comprising a condenser and a recycling pipe, wherein the condenser is disposed in the enclosure and is configured to condense a vaporized coolant in the enclosure to produce the liquid coolant, the vaporized coolant vaporized from the liquid coolant, the recycling pipe is connected to the enclosure and the cooling tank, and the recycling pipe is configured to guide the liquid coolant produced by the condenser to flow into the cooling tank.

4. The immersion cooling system of claim 1, further comprising a condenser disposed in the cooling tank and configured to perform a condensing operation, wherein the condensing operation comprises causing a vaporized coolant which vaporized from the liquid coolant to condense, and when the first valve is closed, the condenser is configured to speed up or slow down the condensing operation as the gas pressure inside the cooling tank changes.

5. The immersion cooling system of claim 1, further comprising an expansion device, wherein the expansion device communicates with the part of the cooling tank above the liquid coolant, and when the first valve is closed, the expansion device is configured to adjust its volume as the gas pressure inside the cooling tank changes.

6. The immersion cooling system of claim 5, further comprising a condenser, wherein when the gas pressure inside the cooling tank exceeds a threshold value, the condenser is configured to condense at least part of a vapor flowing from the cooling tank towards the expansion device, wherein the threshold value is lower than the first upper limit.

7. The immersion cooling system of claim 1, further comprising a second valve having two ports, wherein one of the two ports of the second valve communicates with the cooling tank and the other of the two ports of the second valve communicates with a surrounding environment external to the cooling tank and the housing, wherein the second valve is configured to open in response to the gas pressure inside the cooling tank dropping below a lower limit.

8. An immersion cooling method, comprising:
immersing an electronic device in a liquid coolant in a cooling tank;
providing a housing, the housing covering a side of the cooling tank and thereby forming an enclosure;
opening a first valve in response to a gas pressure inside the cooling tank exceeding a first upper limit, wherein the opening of the first valve enables flow of gas from the cooling tank to the enclosure; and
providing a safety valve having two ports, wherein one of the two ports directly communicates with the enclosure and the other of the two ports directly communicates with a part of the cooling tank above the liquid coolant, wherein the safety valve is configured to open automatically in response to the gas pressure inside the cooling tank exceeding a second upper limit to enable the flow of gas from the cooling tank to the enclosure without losing gas to atmosphere, wherein the second upper limit is higher than the first upper limit.

9. The method of claim 8, wherein the step of opening the first valve comprises:
receiving a sensing signal from a pressure sensor, the sensing signal being indicative of the gas pressure inside the cooling tank;
determining whether the gas pressure inside the cooling tank exceeds the first upper limit based on the sensing signal; and
instructing the first valve to open if it is determined that the gas pressure inside the cooling tank exceeds the first upper limit.

10. The method of claim 8, further comprising:
condensing a vaporized coolant in the enclosure, wherein the vaporized coolant vaporized from the liquid coolant; and
guiding the liquid coolant condensed from the vaporized coolant in the enclosure to flow into the cooling tank.

11. The method of claim 8, further comprising:
opening a second valve in response to the gas pressure inside the cooling tank dropping below a lower limit, wherein the opening of the second valve enables flow of gas from a surrounding environment to the cooling tank, and wherein the surrounding environment is external to the cooling tank and the housing.

12. The method of claim 8, further comprising:
before the first valve is opened, controlling the gas pressure inside the cooling tank by an expansion device communicating with the cooling tank.

13. The method of claim 12, further comprising:
condensing, by a condenser, at least part of a vapor flowing from the cooling tank towards the expansion device when the gas pressure inside the cooling tank exceeds a threshold value, wherein the threshold value is lower than the first upper limit.

14. The method of claim 8, further comprising:
before the first valve is opened, controlling the gas pressure inside the cooling tank by a condenser located in the cooling tank, the condenser being configured to speed up or slow down a condensing operation as the gas pressure inside the cooling tank changes.

* * * * *